United States Patent [19]

Foster et al.

[11] Patent Number: 5,434,110
[45] Date of Patent: Jul. 18, 1995

[54] METHODS OF CHEMICAL VAPOR DEPOSITION (CVD) OF TUNGSTEN FILMS ON PATTERNED WAFER SUBSTRATES

[75] Inventors: Robert F. Foster, Weston, Mass.; Helen E. Rebenne, Fair Lawn, N.J.

[73] Assignee: Materials Research Corporation, Orangeburg, N.Y.

[21] Appl. No.: 898,492

[22] Filed: Jun. 15, 1992

[51] Int. Cl.$^6$ .......................................... H01L 21/44
[52] U.S. Cl. .................................. 437/245; 437/192; 437/203
[58] Field of Search ............... 437/225, 228, 238, 187, 437/240, 245; 118/730, 715

[56] References Cited

U.S. PATENT DOCUMENTS

| | | |
|---|---|---|
| 3,641,974 | 2/1972 | Yamada et al. |
| 4,404,236 | 9/1983 | Komatsu et al. |
| 4,565,157 | 1/1986 | Brors et al. |
| 4,654,509 | 3/1987 | Robinson et al. |
| 4,772,356 | 9/1988 | Schumaker et al. |
| 4,789,771 | 12/1988 | Robinson et al. |
| 4,794,019 | 12/1988 | Miller. |
| 4,798,165 | 1/1989 | deBoer et al. ............ 118/730 |
| 4,800,105 | 1/1989 | Nakayama ................ 118/730 |
| 4,821,674 | 4/1989 | deBoer et al. |
| 4,828,224 | 5/1989 | Crabb et al. |
| 4,828,870 | 5/1989 | Ando et al. |
| 4,839,145 | 6/1989 | Gale et al. |
| 4,846,102 | 7/1989 | Ozias. |
| 4,851,295 | 7/1989 | Brors. |
| 4,868,003 | 9/1989 | Temple et al. |
| 4,976,996 | 12/1990 | Monkowski et al. |
| 4,986,216 | 1/1991 | Ohmori et al. ............ 118/730 |
| 4,993,355 | 2/1991 | deBoer et al. |
| 4,994,301 | 2/1991 | Kusumoto et al. .......... 118/730 |
| 4,996,942 | 3/1991 | deBoer et al. |
| 5,040,046 | 8/1991 | Chhabra et al. .......... 427/255.3 |
| 5,063,031 | 11/1991 | Sato ........................ 118/730 |
| 5,106,453 | 4/1992 | Benko et al. ............... 437/80 |

FOREIGN PATENT DOCUMENTS

| | | |
|---|---|---|
| 0196806 | 10/1986 | European Pat. Off. |
| 0251650 | 1/1988 | European Pat. Off. |
| 0428839 | 5/1991 | European Pat. Off. |
| 6013701 | 6/1983 | Japan. |
| 3094061 | 4/1991 | Japan. |

OTHER PUBLICATIONS

K. Sugawara, "Silicon Epitaxial Growth by Rotating Disk Method", 1972, pp. 1749-1760.
M. L. Hitchman et al., "The Study of CVD Processes With Rotating Discs", 1977, pp. 1021-1029.
R. Pollard et al., "Silicon Deposition on a Rotating Disk", 1980, pp. 744-752.
M. L. Hitchman et al., "Heterogeneous Kinetics and Mass Transfer in Chemical Vapour Deposition Processes. Part II. Application to Silicon Epitaxy", 1981, pp. 283-296.
M. L. Hitchman et al., "Heterogeneous Kinetics & Mass Transfer in Chemical Vapour Deposition Processes.

(List continued on next page.)

Primary Examiner—R. Bruce Breneman
Assistant Examiner—Linda J. Fleck
Attorney, Agent, or Firm—Wood, Herron & Evans

[57] ABSTRACT

Methods of chemical vapor deposition (CVD) are disclosed wherein high quality films are deposited on patterned wafer substrates. In the methods, a patterned wafer is rotated about an axis thereof in a CVD reaction chamber and reactant gases are directed into the reaction chamber and toward the patterned wafer substrate in a direction generally perpendicular to the plane of rotation of the wafer. The reaction chamber is maintained at a suitable pressure and the wafer is heated to a suitable temperature whereby a high quality film is deposited by CVD on the patterned wafer substrate. The process is applicable to deposit elemental films, compound films, alloy films and solid solution films, and is particularly advantageous in that high film deposition rates and high reactant conversion rates are achieved.

2 Claims, 1 Drawing Sheet

OTHER PUBLICATIONS

Part III. The Rotating Disc Reactor", 1982, pp. 43–56.

G. Evans et al., "A Numerical Model of the Flow and Heat Transfer in a Rotating Disk Chemical Vapor Deposition Reactor", 1987, pp. 928–935.

M. E. Coltrin et al., "A Mathematical Model of the Fluid Mechanics and Gas–Phase Chemistry in a Rotating Disk Chemical Vapor Deposition Reactor", 1989, pp. 819–829.

G. S. Tompa et al., "A Parametric Investigation of GaAs Epitaxial Growth Uniformity in a High Speed, Rotating-Disk MOCVD Reactor", 1988, pp. 220–227.

G. S. Tompa et al., "MOCVD Growth of CdTe and HgTe on GaAs in a Vertical, High–Speed, Rotating-Disc Reactor", 1989 pp. 447–452.

G. S. Tompa et al., "MOVPE Growth of II-VI Compounds in a Vertical Reactor with High-Speed Horizontal Rotating Disk", 1991, pp. 198–202.

M. A. McKee et al., "Growth of Highly Uniform, Reproducible InGaAs Films in a Multiwafer Rotating Disk Reactor by MOCVD", 1991, pp. 445–451.

P-I. Lee et al., "Chemical Vapor Deposition of Tungsten (CVD W) as Submicron Interconnection and Via Stud", 1989, pp. 2108–2112.

H. Y. Kumagai, "Plasma Enhanced CVD", 1984, pp. 189–205.

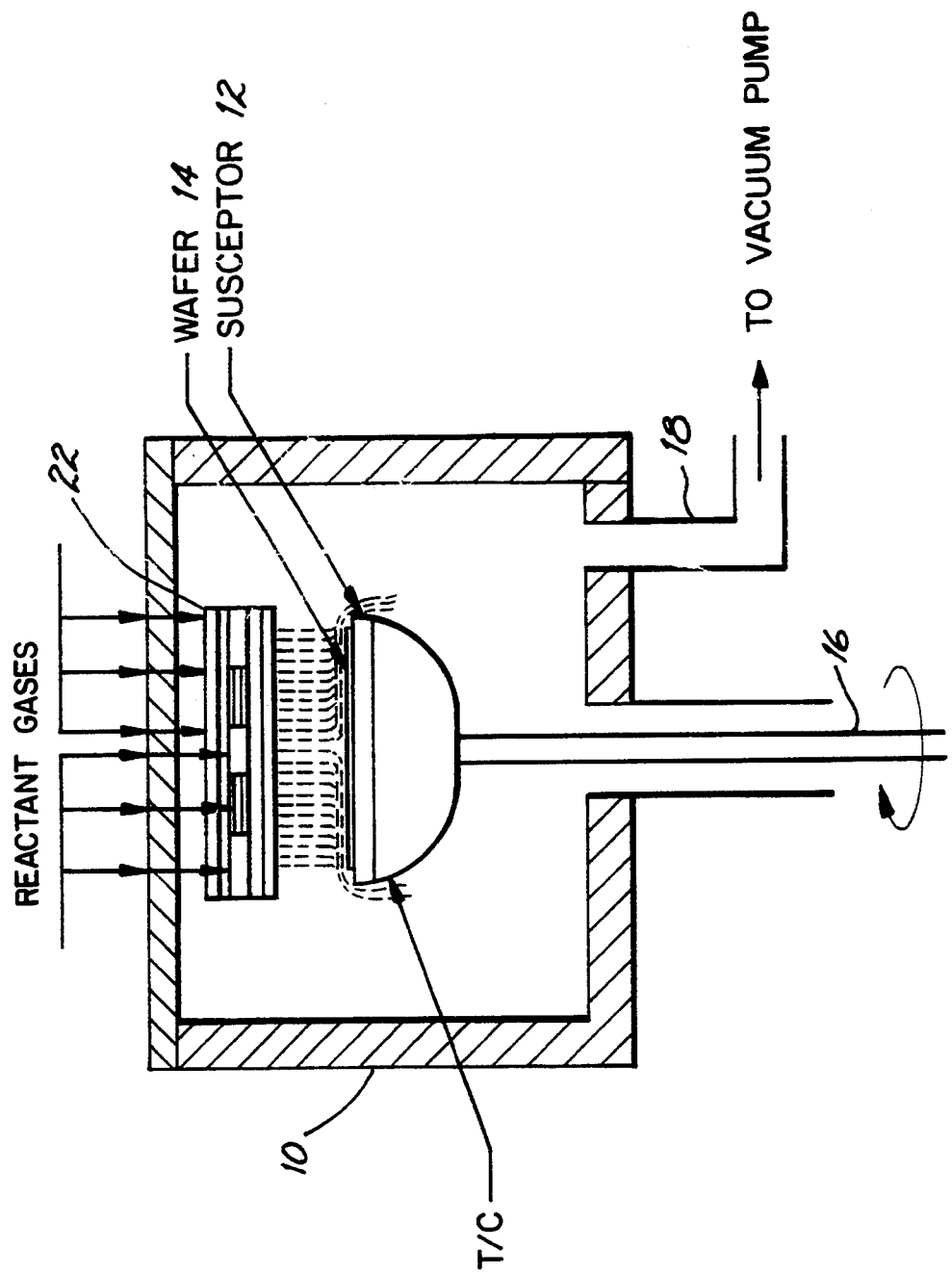

METHODS OF CHEMICAL VAPOR DEPOSITION (CVD) OF TUNGSTEN FILMS ON PATTERNED WAFER SUBSTRATES

FIELD OF THE INVENTION

The present invention relates to chemical vapor deposition (CVD) methods for producing semiconductor wafers, and, more particularly, to methods for depositing films on patterned wafer substrates which achieve enhanced film deposition rates and reactant conversion rates without sacrificing film quality.

BACKGROUND OF THE INVENTION

In the manufacture of semiconductor devices, certain coating processes are performed by chemical vapor deposition (CVD). The two general types of CVD processes are blanket and selective CVD. In blanket CVD, desired film coatings are deposited over the entire exposed surface of the semiconductor wafer. In selective CVD, desired film coatings are applied to the exposed surfaces of the contact or via holes which pass through the insulative layers on the semiconductor wafers; e.g., to provide plugs of conductive material for the purpose of making interconnections across the insulating layers.

Frequently, the desired ultimate result of CVD processes is for filling holes or vias and for forming interconnections between layers on semiconductor wafers. This can be accomplished in one of two ways: 1) formation of the desired film coating on only selected portions of the wafer surfaces by selective deposition; and 2) blanket film deposition with subsequent etching. Because direct selective application by CVD of film coatings may be unreliable, unsuccessful, and/or slow, and thus undesirable on a commercial scale where rapid throughput and efficient use of expensive machinery is important, selective coatings are often achieved by blanket deposition and subsequent etching back from the areas where permanent coating is not desired. When utilizing blanket CVD followed by etching back of the deposited material, a high degree of thickness uniformity in the blanket coating is required, particularly in the areas where the deposited material is to be etched. If the film coating thickness is irregular in the etched-back areas, the etching process may selectively damage the underlying layers or may result in regions where residual coating remains. Known blanket CVD processes of the prior art have coated substrates with limited uniformity and/or at limited speed. Accordingly, processes for the application of blanket coatings of acceptable thickness uniformity and at relatively higher speeds are required.

To uniformly apply coatings such as tungsten (W) by CVD to semiconductor wafers, it is desirable to ensure a uniform supply of reactant gases across the surface of the wafer, and to uniformly remove spent gases and reaction by-products from the surfaces being coated. In this regard, prior art CVD processes perform with limited success. Accordingly, there is a need for processes which more efficiently and more uniformly supply reaction gases to and remove reaction by-products from the surfaces of wafers being coated in CVD processes, either blanket or selective.

In CVD processes using known reactors, turbulence in the flow of reaction gases has inhibited the efficiency and uniformity of the coating process and has aggravated the deposition and migration of contaminants within the reaction chamber. Accordingly, there is a need for CVD processes which have improved gas flow and reduced gas flow turbulence.

In both selective and blanket CVD processes, particularly tungsten CVD processes, tungsten hexafluoride ($WF_6$) is employed as a reactant gas. Tungsten hexafluoride is very costly and thus when reactant gas utilization efficiency is low, as in many prior art processes, the overall process costs are significantly increased. For example, some prior art CVD processes are believed to have a utilization efficiency of $WF_6$ as low as about 20% or less, and thus the cost of $WF_6$ often exceeds 30% of the overall cost of the CVD process. Accordingly, CVD processes that are more efficient in the consumption (conversion) of reactant gases, such as $WF_6$, are desired.

The use of rotating disk CVD reactors to achieve improved control of the deposited film properties on flat, unpatterned substrates has been shown. It has been demonstrated that good thickness uniformity across the diameter of an entire wafer is achievable using a rotating disk reactor due to the ability to control the boundary layer thickness across the entire wafer surface. Such boundary layer thickness control is a fundamental feature of the geometry of rotating disk systems. In contrast, other known types of reactors commonly used in CVD to deposit thin films on silicon wafers have a continuously changing boundary layer across a given wafer in the direction of gas flow. Epsilon Technology, Inc. has shown the efficacy of using rotating disk reactors for epitaxial silicon CVD on silicon wafers. However, it is believed that none of this prior work has been practiced on patterned wafers, and thus uniform deposition of high quality films onto wafers which fill the patterned holes or vias, whether by blanket or selective deposition, has never been demonstrated. Accordingly, CVD processes for selective and blanket deposition of conductive layers on patterned semiconductor substrates which exhibit uniform thickness, good step coverage, uniform resistivity and other desirable film qualities are required.

SUMMARY OF THE INVENTION

The CVD methods of the present invention are believed to overcome or obviate many of the shortcomings associated with prior art CVD processes. More particularly, in the CVD methods of the present invention, films of desired composition are deposited by CVD on a patterned wafer substrate in a significantly more economical manner than heretofore known, based on higher deposition rates and greater reactant conversion rates, and resulting in high quality films. As used herein, the term "film" is intended to mean either blanket films or selectively deposited films.

Since patterned wafer substrates include patterned holes or vias, it is imperative that complete and uniform step coverage be achieved so as not to produce semiconductor wafers with void regions which tend to reduce the quality and reliability of the end product. The methods of the present invention provide excellent step coverage and thickness uniformity in the deposited film layer. The films deposited utilizing the methods of the present invention also possess high quality in terms of resistivity, crystallinity, grain size, stress, particle count, surface roughness and reflectivity.

Additional and perhaps even more important beneficial results obtained by employing the processes of the present invention are the improved rate of processing wafers and reduced consumption of reactant materials which result from the significantly improved deposition rates and reactant conversion rates realized. These advantages contribute greatly to the rate at which patterned wafers can be processed, while at the same time reducing the overall consumption of reactant materials with the increased conversion efficiency.

In its broadest applications, the methods of the present invention are used in the manufacture of integrated circuits or other semiconductor devices to form blanket films which are subsequently etched back to form interconnect lines, contacts, and via plugs on patterned wafer substrates. Alternatively, the desired lines, contacts and plugs are selectively deposited only in the desired contacts or vias. Controlling whether the film is deposited in a blanket or selective manner can be accomplished by controlling the reaction conditions. Typically, under certain conditions selectivity occurs because the deposited material nucleates only on electrically conductive surfaces. Since the bottom of the contact or via holes is typically conductive (e.g., silicon), and while the exposed top surface of the wafer is typically insulating (e.g., silicon dioxide), the deposited film nucleates and grows only on the bottom of the contact or via.

It is contemplated that the methods of the present invention have applicability to deposit blanket or selective elemental films, compound films, alloy films, and solid solution films on patterned wafer substrates. More particularly, the invention contemplates depositing elemental films such as tungsten, copper, aluminum, silicon and titanium. The invention further contemplates depositing compound films such as titanium nitride (TiN), titanium disilicide ($TiSi_2$), tungsten disilicide ($WSi_2$), silicon dioxide ($SiO_2$) and silicon nitride ($Si_3N_4$). Alloy films contemplated are alloys of aluminum and silicon, and alloys of aluminum, copper and silicon. Finally, the present invention contemplates depositing films of solid solutions such as phosphosilicate glass (PSG) and borophosphosilicate glass (BPSG).

In its broadest aspects, the method of the present invention comprises rotating a patterned wafer substrate about an axis thereof in a CVD reaction chamber while directing reactant gases into the CVD reaction chamber and toward the patterned substrate in a direction generally perpendicular to the plane of rotation of the patterned wafer substrate. The reaction chamber is maintained at an effective pressure and the patterned wafer substrate is heated to an effective temperature whereby the desired film is deposited by chemical vapor deposition on the patterned wafer substrate. By rotating the patterned semiconductor wafer in a plane about its central axis, deposition rates up to 3 times higher than those achieved in conventional CVD reactors result, and reactant conversion up to twice that currently achievable is obtained. High quality films, including excellent via filling, even when the aspect ratio of the vias (i.e., ratio of via depth to width) is high, can be achieved. In addition to obtaining high quality films, the deposition rate and reactant conversion are significantly higher than obtained in other types of processes. This results in higher wafer throughput in a production line and reduced operating costs.

The particular process parameters of operating pressure in the CVD reaction chamber and the temperature to which the patterned wafer substrate is heated are a function of whether blanket or selective deposition is desired and the composition of the film being deposited. By way of example only, to achieve high quality blanket tungsten, the reactor is preferably maintained in the range of 10 to 240 torr and the wafer is preferably heated to a temperature in the range of about 425° C. to 525° C. Where selective tungsten deposition is desired, the pressure in the reaction chamber is preferably maintained in the range of about 0.1 to 1 torr and the patterned wafer substrate is preferably heated to between about 250° C. and 300° C. In either case, blanket or selective tungsten deposition, the wafer substrate is preferably rotated at a rate in the range of about 100-1500 rpm, and the reactant gas flow rate is in the range of about 0.5-5.0 slpm.

While the scope of the present invention is not intended to be limited to any particular rotating disk reactor configuration, concurrent with the development of the present process a rotating disk reactor apparatus has been developed which is particularly suitable for carrying out the process of the present invention. This rotating disk reactor is the subject of a co-pending, commonly assigned patent application entitled "Rotating Susceptor Tungsten CVD Reactor Semiconductor Wafer Processing Cluster Tool Module", naming Robert F. Foster, Helen E. Rebenne, Rene E. LeBlanc, Carl L. White and Rikhit Arora as inventors, filed on even date herewith, the specification of which is hereby expressly incorporated herein by reference.

In practicing the method of the present invention, a patterned wafer being processed is placed on a rotatable disk or plate, referred to as a susceptor. The reactant gases are mixed and enter the reactor and are directed downwardly toward the rotating susceptor and wafer. Rotation of the susceptor sets up a pumping action relative to the gas mixture that pulls gas towards the wafer surface. At the surface, the gas flows radially outwardly in a substantially uniform manner, over the wafer surface and then down past the sides of the susceptor towards an exhaust port. Gas is pumped out of the reaction chamber using a pump in an exhaust line. The wafer is heated by the susceptor which may be heated resistively by a heating element placed inside of the susceptor assembly. Near the hot surface of the wafer, a boundary layer is established which slows the diffusion of reactant gases to the surface where they can react. Reactant gases diffuse through this boundary layer, adsorb onto the wafer surface, and react to form the desired film and associated by-products. The by-products then desorb from the surface and diffuse through the boundary layer to the bulk gas flow where they are carried away by the momentum of the flowing gases.

The rate of film deposition on the wafer surface is governed by the concentration of reactants on the surface and the surface temperature. The concentration of reactants on the surface is in turn related to the boundary layer thickness which is governed primarily by the rotation rate of the susceptor/wafer combination. That is, the boundary layer thickness generally decreases with increasing rotation rate. Generally speaking, the thinner the boundary layer, the more rapid the flux of reactants to the wafer surface and the more rapid the flux of by-products away from the surface. With this increased flux of reactants and by-products to and from the wafer surface comes higher deposition rates and greater reactant conversion. Furthermore, the uniformity of film deposition over the wafer surface is directly determined by the uniformity of the boundary layer over the same area.

These and other objects, advantages and features of the present invention will now be described in detail with reference to the accompanying drawing.

BRIEF DESCRIPTION OF THE DRAWINGS

The Figure is a schematic cross-sectional view of a CVD reactor useful in the practice of the present invention.

DETAILED DESCRIPTION OF THE INVENTION

The Figure shows a schematic representation of the pertinent portions of a rotating disk reactor suitable for practicing the methods of the present invention. Reaction chamber 10 has a rotating susceptor 12 positioned therein for supporting a patterned wafer substrate 14 thereon. The wafer susceptor is rotated in a clockwise direction by means of a motor (not shown) driven shaft 16. Susceptor 12 is further provided with a temperature controller device to heat the wafer to the desired temperature. The reaction chamber is provided with an exhaust port 18 through which the reaction gas by-products and unreacted starting materials are exhausted.

The reactant gases are fed to a reservoir 22 near the top of the reaction chamber where they are mixed. The mixed reactant gases flow downward toward the wafer, which is being rotated by the susceptor, in a direction generally perpendicular to the plane of rotation of the wafer. As indicated by the dotted gas flow lines in the Figure, as the gas approaches the wafer surface it flows radially outwardly in a uniform manner over the entire wafer surface and then down past the sides of the susceptor towards the exhaust port 18. As described previously, the rotation of the susceptor draws the reactant gases toward the wafer surface and establishes a substantially uniform boundary layer across the wafer surface.

Experimental work confirming the advantages of the present invention over prior art CVD methods has been conducted to demonstrate the efficacy of the methods for achieving high tungsten deposition rates with high reactant conversion rates in a rotating disk reactor of the type described above. In the experimental work, a patterned wafer substrate 150 mm in diameter was supplied by Materials Research Corporation for the purpose of testing the step coverage and other film properties achievable utilizing the process of the present invention. The wafer had via dimensions of 1 $\mu$m by 1 $\mu$m and the underlying film was sputtered TiW. The operating conditions were as follows: 1) wafer temperature in the range of 425° C. to 525° C.; 2) reaction chamber pressure at about 70 torr; 3) susceptor rotation rate of about 750 rpm; 4) inlet reactant gas flow rate set to match the rotation rate and estimated to be approximately 1-2 slpm (standard liters per minute); 5) inlet gas temperature about 25° C.; and 6) deposition time of approximately 75 seconds. The resulting tungsten film was 1.6 $\mu$m in thickness, which corresponds to a deposition rate of about 1.3 $\mu$m per minute. Conversion of the tungsten hexafluoride (WF$_6$) starting material was in the range of about 25% to 55%. The resistivity of wafers produced averaged 8.1 $\mu\Omega$cm, with a standard deviation of 6.8%. Step coverage was 100%.

The experimental results of other similar test runs performed on wafers supplied by Materials Research Corporation are compiled in Table I.

TABLE I

| Parameter | Wafer No. | | | | |
|---|---|---|---|---|---|
| | 1 | 2 | 3 | 4 | 5 |
| Film Deposition Rate ($\mu$m/min.) | 0.58 | 0.8 | 0.6 | 2.5 | 3.5 |
| Uniformity (1$\sigma$) | ±10 | ±6 | ±2 | <±2 | <±2 |
| Reflectivity (%) | 60 | 60 | 60 | 60 | 60 |
| Resistivity ($\mu\Omega$-cm) | <9 | <9 | <9 | <9 | <9 |
| Wafer Temperature (°C.) | 525 | 450 | 450 | 450 | 450 |
| Reaction Chamber Pressure (torr) | 70 | 70 | 70 | 70 | 70 |
| WF$_6$ conversion (%) | 55 | 36 | 25 | 50 | 55 |

By way of comparison, tungsten films typically applied by CVD processes wherein the wafer is not rotated, and using reduction of tungsten hexafluoride (WF$_6$) by hydrogen (H$_2$), silane (SiH$_4$), or both, are capable of producing films of high quality, yet are typically limited by relatively low deposition rates and relatively low conversion of WF$_6$. More particularly, the deposition rates in known CVD processes which do not make use of a rotating susceptor and wafer have deposition rates on the order of $\leq 0.5$ $\mu$m per minute and WF$_6$ conversion rates on the order of $\leq 30\%$. As shown in Table I, depositing tungsten films utilizing the process of the present invention has achieved deposition rates up to 3.5 $\mu$m per minute and WF$_6$ conversions of up to 55% with no degradation in film quality. In addition, the method contemplates a wider process window (temperature and pressure) for achieving high quality tungsten films vis-a-vis prior art processes.

The process of the present invention has been shown to achieve high quality blanket tungsten film deposition over a range of operating conditions that demonstrate the wide process window of applicability of the present invention. These operating conditions are: 1) wafer temperature between about 425° and 525° C.; 2) pressure between about 10 to 240 torr; 3) susceptor rotation rate between about 100 rpm to 1500 rpm; 4) inlet gas flow rate between about 0.5 slpm to 5.0 slpm; and 5) inlet gas temperature of about 25° C. It should be noted that utilizing a rotating disk reactor in the method of the present invention provides additional advantages when rotating the wafer at high speed. Namely, the high speed rotation of the wafer enhances the gas distribution uniformity and control of active species within the reaction chamber. This results in an increase in reactor efficiency compared to typical CVD processes and a reduction of deposition of films in undesirable places (i.e., on the reactor walls).

When it is desired to deposit tungsten selectively rather than blanket deposition, it is contemplated that the operating parameters of temperature and pressure should be changed. More particularly, selective tungsten deposition is advantageously performed at a wafer temperatures of between about 250° and 300° C. and at a pressure between about 0.1 torr to 10 torr. It should be noted that the increased reactant conversion realized in the process of the present invention reduces the amount of unreacted reactants passing through the pumping system which have to be scrubbed prior to exhausting to the atmosphere.

The process of the present invention is uniquely advantageous to selectively deposit tungsten, or any other desired film, on the exposed surfaces in the contacts and vias of the patterned wafer substrate. The rotating disk process is ideal for achieving selectivity because of the direction of gas flow in the vicinity of the wafer. Specifically, it is believed that in conventional reactors film deposition selectivity may be lost on a wafer when film deposits on the susceptor adjacent to the wafer edge and grows over onto the wafer, acting as nucleation sites for subsequent film deposition on the planar surfaces of the wafer. In the rotating disk process, this phenomenon is believed to be highly unlikely because the direction of flow at the wafer surface is radially outwardly. Therefore, at the interface between the wafer edge and the susceptor surface, gases are flowing away from the wafer making it difficult for film which has grown on the susceptor to grow over onto the wafer. Furthermore, in the rotating disk, less reactant material is available to deposit film on the susceptor since substantial depletion will have occurred by the time the reactant gases reach the exposed susceptor surface.

As described herein, the process of the present invention is envisioned to encompass both blanket and selective deposition of a wide variety of films useful in semiconductor devices. While specific examples have been given with respect to blanket tungsten deposition, such examples are not intended to be limiting in any way to the scope of the present invention as it is defined in the appended claims. The use of a rotating patterned wafer substrate is common throughout all applications of the process, whether selective or blanket deposition is sought, and thus the advantages of utilizing a rotating disk are present in all contemplated applications of the process. This is true because the rotating wafer processes are uniquely capable of supplying reactant gases uniformly to the wafer surface and "flushing" by-products away from the wafer surface due to the flow hydrodynamics. Thus, regardless of the reactant gas composition, the rotating wafer process approaches a uniform boundary layer thickness and minimizes turbulence in the gas phase. These factors all contribute to the beneficial results achieved by the processes, as discussed herein.

In order to achieve optimum processing uniformity with the rotating susceptor described in embodiments above, the CVD process should be operated under conditions dictated by the rotation rate to achieve the highest deposition rate and reactant conversion without sacrificing film uniformity or properties. To produce these conditions, the total mass flow rate of gas flowing radially outward across the susceptor surface is matched by an equal mass flow rate of gas flowing along the axis from the showerhead toward and against the susceptor surface. The axial flow rate is furnished and controlled by the rate of injection of the inlet gas. If the inlet gas flow rate is too small, the susceptor becomes starved for fluid, while if the inlet gas flow rate is too high, fluid backs up near the susceptor surface. In either case, the velocity profile will not be of the proper shape to give a uniform boundary layer thickness near the susceptor surface and hence the benefits of rotation will not be fully realized. At a given temperature, pressure, inlet gas composition, and susceptor rotation rate, only one inlet gas flow rate or a narrow range of inlet gas flow rates gives optimum operation. This flow rate is commonly referred to as the "matched flow rate" for the given set of conditions they may be determined theoretically or by experimentation for each process and each reactor, and preferably, first theoretically and then verified or fine tuned experimentally. For blanket and selective tungsten CVD, an inlet gas flow rate will fall generally within the range of from 0.5 slpm to 5.0 slpm for the temperatures, pressures, gas composition and rotational speeds discussed above. For example, for blanket tungsten deposition, 0.1 slpm of $WF_6$ and 2.0 slpm for $H_2$, for a total flow of 2.1 slpm, has been found preferable for 425° C., 80 Torr and 750 RPM. For selective tungsten CVD, 0.1 slpm of $SiH_4$, 0.15 slpm for $WF_6$ and 2.75 slpm for $H_2$, for a total flow of 3.0 slpm, has been found preferable for 280° C., 5 Torr, and 250 RPM. Generally, flow rate must be increased when temperature, rotational speed or viscosity are increased, or when pressure is decreased, when the other parameters are held constant.

What is claimed is:

1. A method of depositing a blanket tungsten film by chemical vapor deposition on a patterned wafer substrate, comprising the steps of:

rotating a patterned wafer substrate about an axis thereof in a CVD reaction chamber at a rate in the range of about 100–1500 rpm;

directing reactant gases into the CVD reaction chamber and toward the patterned wafer substrate in a direction generally perpendicular to the plane of rotation of the patterned wafer substrate at a flow rate in the range of about 0.5–5.0 slpm, the reaction chamber maintained at a pressure in the range of about 10–240 torr and the patterned wafer substrate heated to a temperature in the range of about 425°–525° C. whereby a high quality blanket tungsten film is deposited by chemical vapor deposition on the patterned wafer substrate.

2. A method of depositing a selective tungsten film by chemical vapor deposition on a patterned wafer substrate, comprising the steps of:

rotating a patterned wafer substrate about an axis thereof in a CVD reaction chamber at a rate in the range of about 100–1500 rpm;

directing reactant gases into the CVD reaction chamber and toward the patterned wafer substrate in a direction generally perpendicular to the plane of rotation of the patterned wafer substrate at a flow rate in the range of about 0.5–5.0 slpm, the reaction chamber maintained at a pressure in the range of about 0.1–10 torr and the patterned wafer substrate heated to a temperature in the range of about 250°–300° C. whereby a high quality selective tungsten film is deposited by chemical vapor deposition on the patterned wafer substrate.

* * * * *